United States Patent
Li et al.

(10) Patent No.: US 10,004,167 B2
(45) Date of Patent: Jun. 19, 2018

(54) CIRCUIT SHIELDING STRUCTURE

(71) Applicant: Shanghai Allied Industrial Co., Ltd, Shanghai (CN)

(72) Inventors: Yanmin Li, Shanghai (CN); Huanqing Pan, Shanghai (CN)

(73) Assignee: Shanghai Allied Industrial Co., Ltd, Shanghai (CN)

(*) Notice: Subject to any disclaimer, the term of this patent is extended or adjusted under 35 U.S.C. 154(b) by 0 days. days.

(21) Appl. No.: 15/659,616

(22) Filed: Jul. 26, 2017

(65) Prior Publication Data
US 2017/0325366 A1    Nov. 9, 2017

(30) Foreign Application Priority Data

Dec. 5, 2016   (CN) .......................... 2016 1 1102914

(51) Int. Cl.
H05K 9/00       (2006.01)
(52) U.S. Cl.
CPC .......... H05K 9/0024 (2013.01); H05K 9/0039 (2013.01); H05K 9/0088 (2013.01); H01L 2924/3025 (2013.01)
(58) Field of Classification Search
CPC .......... H01L 2924/3025; H05K 9/0024; H05K 9/0039; H05K 9/0088
See application file for complete search history.

(56) References Cited

U.S. PATENT DOCUMENTS

| | | | | |
|---|---|---|---|---|
| 5,838,551 A | * | 11/1998 | Chan | H01L 23/552 174/372 |
| 6,113,425 A | * | 9/2000 | Yee | H01R 23/6873 439/607.28 |
| 2007/0056768 A1 | * | 3/2007 | Hsieh | H05K 9/0024 174/350 |
| 2010/0321252 A1 | * | 12/2010 | Shan | H01Q 1/2283 343/702 |
| 2012/0104570 A1 | * | 5/2012 | Kim | H01L 23/552 257/659 |
| 2012/0228749 A1 | * | 9/2012 | Pagaila | H01L 23/147 257/659 |
| 2015/0163958 A1 | * | 6/2015 | Oguma | H05K 7/20463 264/36.22 |
| 2015/0181773 A1 | * | 6/2015 | Ueda | H05K 9/0028 361/818 |
| 2016/0344444 A1 | * | 11/2016 | Yang | H05K 9/0024 |
| 2017/0280561 A1 | * | 9/2017 | Haney | H05K 1/181 |

* cited by examiner

Primary Examiner — James Wu

(57) ABSTRACT

A circuit shielding structure, relating to a technical field of electronics, includes a substrate, wherein: at least one radio frequency component circuit is fixed on the substrate; a wave-absorbing material layer is embedded in the substrate; a shielding wall made of wave-absorbing material is arranged on the substrate and around the radio frequency component circuit; a conductive material layer covers the shielding wall; a closed space is formed among the substrate in which the wave-absorbing material layer is embedded, the shielding wall and the conductive material layer, and the radio frequency component circuit is sealed in the closed space, so that omnidirectional shielding is achieved.

7 Claims, 3 Drawing Sheets

CIRCUIT SHIELDING STRUCTURE

CROSS REFERENCE OF RELATED APPLICATION

The application claims priority under 35 U.S.C. 119(a-d) to CN 201611102914.4, filed Dec. 5, 2016.

BACKGROUND OF THE PRESENT INVENTION

Field of Invention

The present invention relates to a technical field of electronics, and more particularly to an electromagnetic shielding device.

Description of Related Arts

The smartphone with the integrated chip or other product systems with the radio frequency component will generate the electromagnetic interference or suffer the electromagnetic interference, causing the circuit function being affected.

SUMMARY OF THE PRESENT INVENTION

An object of the present invention is to provide a circuit shielding structure, so as to solve at least one problem in prior arts.

Technical solutions of the present invention are described as follows.

A circuit shielding structure comprises a substrate, wherein:

at least one radio frequency component circuit is fixed on the substrate;

a wave-absorbing material layer is embedded in the substrate;

a shielding wall, which is made of wave-absorbing material, is arranged on the substrate and around the radio frequency component circuit;

a conductive material layer covers the shielding wall; and a closed space is formed among the substrate in which the wave-absorbing material layer is embedded, the shielding wall and the conductive material layer; and the radio frequency component circuit is sealed in the closed space, so that omnidirectional shielding is achieved.

The circuit shielding structure further comprises a ground layer, wherein: the ground layer is arranged on the shielding wall; an upper end of the ground layer is connected to the conductive material layer; a ground terminal is arranged at a lower end of the ground layer, and the ground terminal is connected to the substrate.

Through grounding by the ground terminal on the substrate, zero-potential shielding of the conductive material layer is realized.

The ground layer is made of conductive foam material or conductive rubber material. The ground layer has compressibility for strengthening grounding between the ground layer and the substrate.

Alternatively, the circuit shielding structure comprises a ground layer, wherein: the ground layer is a sleeve or a bolt; an upper end of the ground layer is connected to the conductive material layer; a ground terminal is arranged at a lower end of the ground layer, and the ground terminal is connected to the substrate.

These and other objectives, features, and advantages of the present invention will become apparent from the following detailed description, the accompanying drawings, and the appended claims.

DETAILED DESCRIPTION OF THE PREFERRED EMBODIMENT

Figure 1:
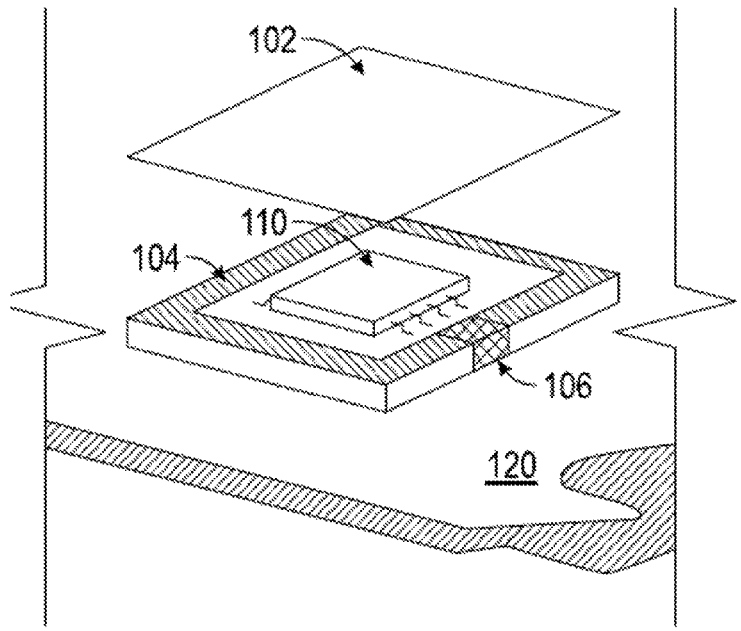
FIG. 1 is a first structural sketch view of a circuit shielding structure according to a preferred embodiment of the present invention.
Figure 2:
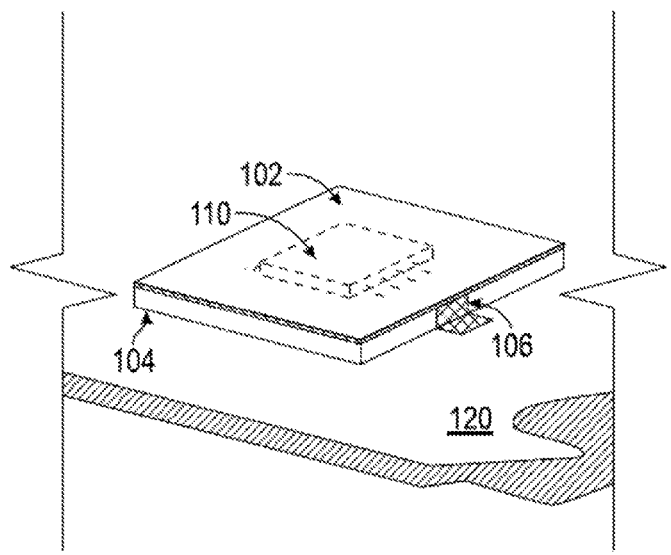
FIG. 2 is a second structural sketch view of the circuit shielding structure according to the preferred embodiment of the present invention.
Figure 3:
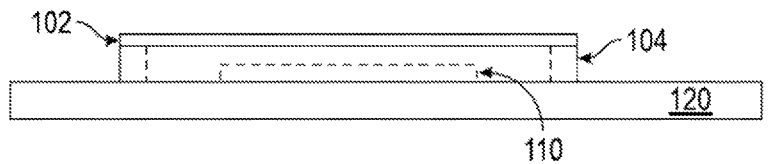
FIG. 3 is a perspective view of the circuit shielding structure showed in FIG. 1.

In order to better understand technical solutions, features, objects and advantages of the present invention, the present invention is further illustrated with the accompanying drawings.

Referring to FIGS. 1-3 and 7, according to a preferred embodiment of the present invention, a circuit shielding structure comprises a substrate, wherein: a radio frequency component circuit 110 is fixed on the substrate; a wave-absorbing material layer 130 is embedded in the substrate; a shielding wall 104, which is made of wave-absorbing material, is arranged on the substrate and around the radio frequency component circuit 110; a conductive material layer 102 covers the shielding wall 104; a closed space is formed among the substrate in which the wave-absorbing material layer is embedded, the shielding wall 104 and the conductive material layer 102; and the radio frequency component circuit is sealed in the closed space, so that omnidirectional shielding is achieved.

The circuit shielding structure further comprises a ground layer 106, wherein: the ground layer 106 is arranged on the shielding wall 104; an upper end of the ground layer 106 is connected to the conductive material layer 102; a ground terminal is arranged at a lower end of the ground layer, and the ground terminal is connected to the substrate. Through grounding by the ground terminal on the substrate, zero-potential shielding of the conductive material layer 102 is realized. The ground layer is made of conductive foam material or conductive rubber material. The ground layer has compressibility for strengthening grounding between the ground layer and the substrate.

Figure 5:
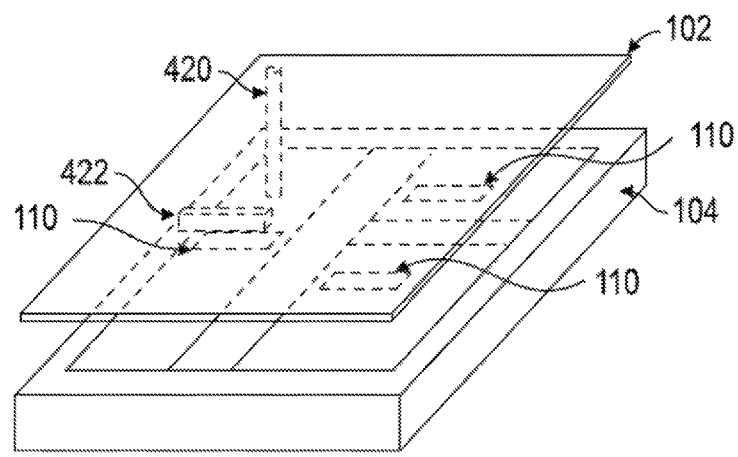
FIG. 5 is a fourth structural sketch view of the circuit shielding structure according to the preferred embodiment of the present invention.

Alternatively, the ground layer is a ground metal layer. Referring to FIG. 5, the circuit shielding structure comprises the ground metal layer, wherein: the ground metal layer is a sleeve 420, wherein the ground metal layer can be a bolt in other embodiments of the present invention; an upper end of the ground metal layer is connected to the conductive material layer 102; a ground terminal is arranged at a lower end of the ground metal layer, and the ground terminal is connected to the substrate. A ground (GND) hole is provided on the substrate, for fixing the sleeve or the bolt.

A circuit board 120 serves as the substrate. The circuit board holds the radio frequency component circuit, and the wave-absorbing material layer is embedded in the circuit board, which saves a cost of the wave-absorbing material layer and realizes the omnidirectional shielding.

Preferably, the conductive material layer is embodied as an aluminum sheet, which not only realizes electromagnetic interference shielding, but also realizes a heat dispersion effect. Preferably, the conductive material layer 102 is embodied as conductive fabric for realizing an electromagnetic interference shielding effect.

Preferably, the conductive material layer 102 is made from a mixed material which comprises following components by weight percentage of: aluminum: 5%-40%; copper: 10%-30%; gallium: 1%-5%; indium: 10%-20%; and zinc: 10%-20%. Through optimizing a structure of the conductive material layer 102, the present invention not only realizes the electromagnetic shielding effect, but also has an excellent heat dispersion performance. Further preferably, the conductive material layer 102 is made from the mixed material which comprises following components by weight percentage of: aluminum: 40%; copper: 20%; gallium: 5%; indium: 15%; and zinc: 20%. It is proved by experiments that the conductive material layer 102 with the above composition is lightweight and has the excellent heat dispersion performance.

An upper surface of the conductive material layer 102 is connected to a heat dispersion layer 108 made of heat dispersing material. Through the heating dispersion layer, heat diffusion is realized, and therefore a hotspot caused by a temperature increase of the radio frequency component circuit is avoided.

Because of a good heat dispersion effect of graphite, the heat dispersion layer is made of graphite.

Figure 4:
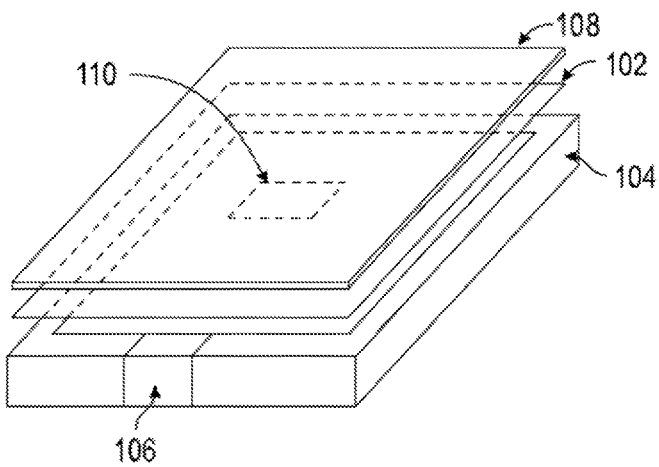
FIG. 4 is a third structural sketch view of the circuit shielding structure according to the preferred embodiment of the present invention.

Preferably, referring to FIG. 4, the conductive material layer 102 is embodied as a copper foil and has a thickness of 7-15 μm. The heat dispersion layer 108 is embodied as a graphite sheet and has a thickness of 20-30 μm.

Figure 7:
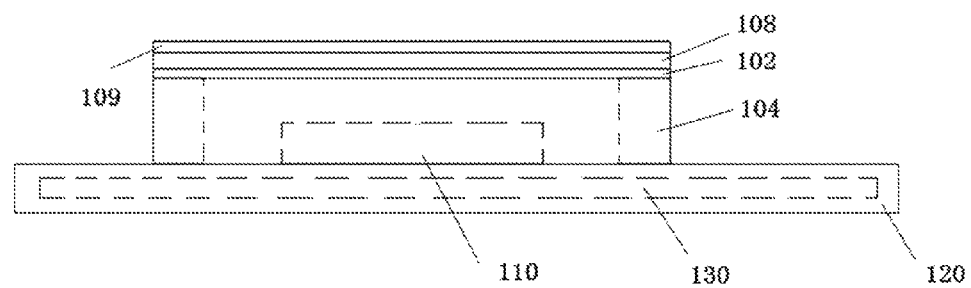
FIG. 7 is a fifth structural sketch view of the circuit shielding structure according to the preferred embodiment of the present invention.

Referring to FIG. 7, an upper surface of the heat dispersion layer 108 is connected to a polyethylene terephthalate (PET) protective film 109 which has a thickness of 4-7 μm. It is proved by the experiments that: with the above structure, under the premise of cost control, the heat dispersion performance is excellent, and a service life is long. The above structure is applicable to electromagnetic shielding of a radio frequency component circuit of a smartphone.

Referring to FIG. 5, the shielding wall 104 is around multiple radio frequency component circuits 110, so that a shielding effect of the shielding wall to multiple radio frequency component circuits is realized.

Preferably, referring to FIG. 5, the conductive material layer 102 is connected to the radio frequency component circuit through a heat conduction pad 422, so that heat of the radio frequency component circuits is transmitted to the outside through the conductive material layer 102.

Preferably, the conductive material layer 102 is connected to the radio frequency component circuit through a pressure-sensitive adhesive, so that the heat of the radio frequency component circuit is transmitted to the outside through the conductive material layer 102. The conductive material layer 102 is connected to the shielding wall 104 through the pressure-sensitive adhesive, so that a non-conductive connection between the conductive material layer 102 and the shielding wall 104 is realized. The shielding wall 104 is connected to the circuit board 120 through the pressure-sensitive adhesive, so that a non-conductive connection between the circuit board 120 and the shielding wall 104 is realized. The shielding wall 104 is made of wave-absorbing material. The shielding wall 104 is formed through die-cutting the wave-absorbing material to a shape around the radio frequency component circuit.

Preferably, the wave-absorbing material is a radio frequency wave-absorbing material, so as to resist the electromagnetic interference.

The wave-absorbing material is a sponge-based radio frequency wave-absorbing material. The radio frequency wave-absorbing material comprises a base made of sponge, wherein: a wave-absorbing layer is coated on an outer surface of the base; a gap exists in the base, and conductive metal particles are filled in the gap.

The wave-absorbing layer is made from a mixed material which comprises following components by weight percentage of: magnetic ferroferric oxide nanoparticles: 10%-30%; silicon carbide: 10%-20%; silica sol: 10%-20%; hexadecylamine: 5%-20%; vulcanized rubber: 1%-5%; aerogel: 5%-20%; and graphite fiber: 1%-5% to realize multi-dimensional wave absorption of the wave-absorbing material for obtaining an excellent wave-absorbing performance.

Preferably, the wave-absorbing material is an adhesive. Through the wave-absorbing material, the electromagnetic interference is isolated, and meanwhile a fixed connection between the conductive material layer 102 and the circuit board 120 is realized.

Preferably, the wave-absorbing material comprises following components by weight percentage of: magnetic ferroferric oxide nanoparticles: 10%-30%; silicon carbide: 10%-20%; silica sol: 10%-20%; hexadecylamine: 5%-20%; aerogel: 5%-20%; and gallium metal: 1%-5%. Through optimizing composition of the wave-absorbing material, it is proved by the experiments that the wave-absorbing material with the above composition has the excellent wave-absorbing performance and is able to serve as the adhesive, which realizes a connection between the conductive material layer 102 and the circuit. Moreover, the present invention combines the aerogel with the gallium metal. Because of micropores of the aerogel, the gallium metal easily penetrates into the aerogel, which realizes an overall heat dispersion of the wave-absorbing material. The wave-absorbing material further comprises graphite fiber with a weight percentage of 1%-5%, so as to further improve the heat dispersion effect.

Figure 8:
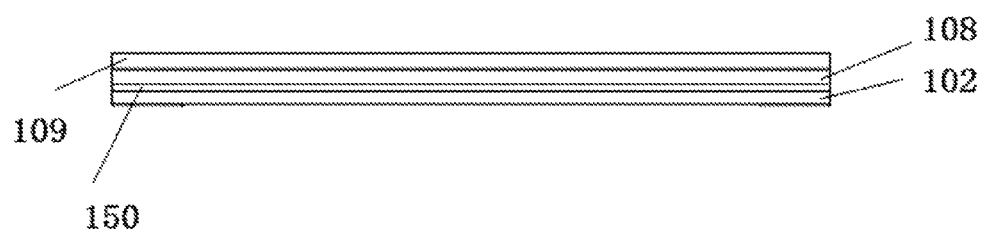
FIG. 8 is a structural sketch view of an enhancement layer, a heat dispersion layer and a polyethylene terephthalate protective film which are arranged on a conductive material layer according to the preferred embodiment of the present invention.

Referring to FIG. 8, an enhancement layer 150 is arranged on the conductive material layer 102, for further improving the electromagnetic shielding effect. The enhancement layer 150 is made from a mixed material which comprises components of vinyl dimethicone, reinforced particles, silicone oil, and conductive powders with a weight ratio of (20-150):(0-20):(0-20):(110-700); the conductive powders comprise large-particle-size spherical conductive powders, small-particle-size spherical conductive powders and non-spherical conductive powders with a weight ratio of (100-500):(10-100):(0-100); the reinforced particles comprise at least two members selected from a group consisting of white carbon black, calcium carbonate, silica powders, kieselguhr and titanium dioxides. Through adopting a composite system of the conductive powders of different particle sizes and different shapes and a combination of the conductive powders of large particle sizes with small particle sizes, the present invention realizes an ideal powder accumulation effect and better conductivity, increases conductive paths and improves a conductive performance. An upper surface of the enhancement layer 150 is connected to the heat dispersion layer 108, and the upper surface of the heat dispersion layer 108 is connected to the PET protective film 109.

Referring to FIG. 5, each radio frequency component circuit comprises at least two integrated chips, wherein: the conductive material layer 102 is connected to the integrated chips through the heat conduction pad 422, so that heat of the integrated chips is transmitted to the outside through the conductive material layer 102. The ground layer is the sleeve 420. In other embodiments of the present invention, the ground layer can be the bolt.

The radio frequency component circuit comprises the integrated chips, wherein: a metal block is fixed on each integrated chip and serves as a heat dispersion metal block; an upper part of the heat dispersion metal block contacts the conductive material layer which is a metal sheet, so that the heat of the integrated chip is transmitted to the conductive material layer namely the metal sheet through the heat dispersion metal block and therefor the heat is transmitted to the outside.

Figure 6:
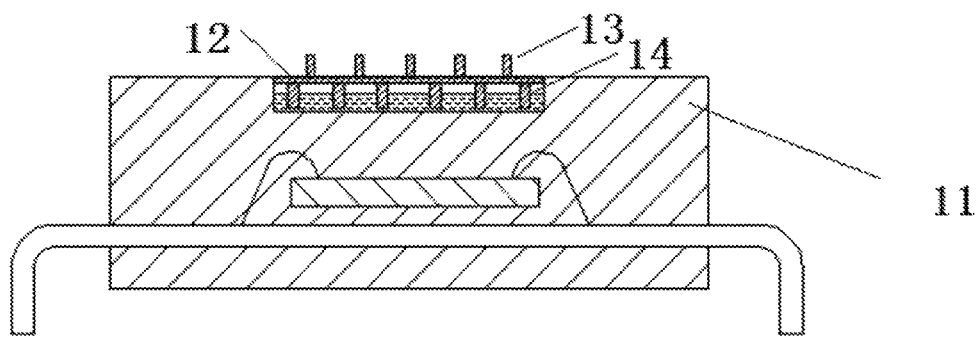
FIG. 6 is a sectional view of an integrated chip according to the preferred embodiment of the present invention.

Referring to FIG. 6, the radio frequency component circuit comprises the integrated chips, wherein: each integrated chip comprises a sealed housing 11 made of plastic; a containing chamber for containing liquid metal is arranged at an upper part of the sealed housing 11 and serves as a heat dispersion window; a heat dispersion device 12 made of steel is arranged at an upper part of the containing chamber; five needle-shaped protruding parts 13, which protrude upwardly, are arranged on the heat dispersion device12, wherein the number of the needle-shaped protruding parts can be more than five in other embodiments of the present invention; and the heat dispersion device covers the containing chamber, for sealing the containing chamber. The liquid metal is liquid at a high temperature (above 40° C.). When the heat of the integrated chip is required to be dispersed, the liquid metal is transformed to liquid. Because of liquidity of liquid, under an effect of a temperature difference from top to bottom, convection is generated, and thus the liquid metal has a far better heat dispersion performance than the solid metal. The present invention combines the convection heat dispersion of the liquid metal with the heat dispersion device made of solid metal, which not only guarantees a heat exchange performance of the liquid metal but also realizes sealing of the liquid metal and guarantees a safety of the circuit. Moreover, the present invention adopts the heat dispersion device made of steel, not the common heat dispersion device made of aluminum, which avoids dissolution and corrosion of the same-phase metal and facilitates heat dispersion of the integrated chip. Furthermore, an upper part of each needle-shaped protruding part contacts the conductive material layer, for heat dispersion. A lower part of the heat dispersion device is connected with sheet-shaped objects 14 which are inserted into the liquid metal and exchange heat with the liquid metal, so as to improve the heat dispersion effect. The sheet-shaped objects 14 are made of steel or carbon fiber. The liquid metal can be gallium alloy or indium-gallium alloy.

Basic principles, main features and advantages of the present invention are showed and described as above. One skilled in the art will understand that the above embodiment of the present invention is merely for illustrating the principles of the present invention and not intended to be limiting. Within the spirit and scope of the present invention, various changes and modifications are included in the protection scope of the present invention. The protection scope of the present invention is defined by the following claims and equivalents thereof.

What is claimed is:

1. A circuit shielding structure, comprising a substrate, wherein:
   a radio frequency component circuit is fixed on the substrate;
   a wave-absorbing material layer is embedded in the substrate;
   a shielding wall, which is made of wave-absorbing material, is arranged on the substrate and around the radio frequency component circuit;
   a conductive material layer covers the shielding wall;
   a closed space is formed among the substrate in which the wave-absorbing material layer is embedded, the shielding wall and the conductive material layer; and the radio frequency component circuit is sealed in the closed space, so that omnidirectional shielding is achieved;
   the circuit shielding structure further comprises a ground layer, wherein: the ground layer is arranged on the shielding wall; an upper end of the ground layer is connected to the conductive material layer; a ground terminal is arranged at a lower end of the ground layer, and the ground terminal is connected to the substrate, so that through grounding by the ground terminal on the substrate, zero-potential shielding of the conductive material layer is realized;
   the ground layer is made of conductive foam material or conductive rubber material; the ground layer has compressibility for strengthening grounding between the ground layer and the substrate;
   a circuit board serves as the substrate; the circuit board holds the radio frequency component circuit, and the wave-absorbing material layer is embedded in the circuit board, which saves a cost of the wave-absorbing material layer and realizes the omnidirectional shielding;
   the radio frequency component circuit comprises an integrated chip, wherein: the integrated chip comprises a sealed housing made of plastic; a containing chamber for containing liquid metal is arranged at an upper part of the sealed housing and serves as a heat dispersion window; a heat dispersion device made of steel is arranged at an upper part of the containing chamber; at least five needle-shaped protruding parts, which protrude upwardly, are arranged on the heat dispersion device; and the heat dispersion device covers the containing chamber;
   a lower part of the heat dispersion device is connected with a sheet-shaped object which is inserted into the liquid metal and exchanges heat with the liquid metal, and the sheet-shaped object is made of steel; and
   the liquid metal is gallium alloy.

2. The circuit shielding structure, as recited in claim 1, wherein the conductive material layer is made from a mixed material which comprises following components by weight percentage of: aluminum: 5%-40%; copper: 10%-30%; gallium: 1%-5%; indium: 10%-20%; and zinc: 10%-20%; through optimizing a structure of the conductive material layer, an electromagnetic shielding effect and an excellent heat dispersion performance are realized.

3. The circuit shielding structure, as recited in claim 1, wherein the conductive material layer is made from a mixed material which comprises following components by weight percentage of: aluminum: 40%; copper: 20%; gallium: 5%; indium: 15%; and zinc: 20% to obtain a light weight and an excellent heat dispersion performance.

4. The circuit shielding structure, as recited in claim 1, wherein: an upper surface of the conductive material layer is connected to a heat dispersion layer made of heat dispersing material; through the heating dispersion layer, heat diffusion is realized, and therefore a hotspot caused by a temperature increase of the radio frequency component circuit is avoided; and the heat dispersion layer is made of graphite;

the conductive material layer is embodied as a copper foil and has a thickness of 7-15 μm; and, the heat dispersion layer is embodied as a graphite sheet and has a thickness of 20-30 μm;

an upper surface of the heat dispersion layer is connected to a polyethylene terephthalate (PET) protective film which has a thickness of 4-7 μm; and the shielding wall is arranged around at least one radio frequency component circuit, so that a shielding effect of the shielding wall to multiple radio frequency component circuits is realized.

5. The circuit shielding structure, as recited in claim 1, wherein: the wave-absorbing material is a sponge-based radio frequency wave-absorbing material; the radio frequency wave-absorbing material comprises a base made of sponge; a wave-absorbing layer is coated on an outer surface of the base; a gap exists in the base, and conductive metal particles are filled in the gap; and the wave-absorbing layer is made from a mixed material which comprises following components by weight percentage of: magnetic ferroferric oxide nanoparticles: 10%-30%; silicon carbide: 10%-20%; silica sol: 10%-20%; hexadecylamine: 5%-20%; vulcanized rubber: 1%-5%; aerogel: 5%-20%; and graphite fiber: 1%-5% to realize multi-dimensional wave absorption of the wave-absorbing material for obtaining an excellent wave-absorbing performance.

6. The circuit shielding structure, as recited in claim 1, wherein: the wave-absorbing material is an adhesive for isolating an electromagnetic interference and meanwhile realizing a fixed connection between the conductive material layer and the circuit board; and the wave-absorbing material comprises following components by weight percentage of: magnetic ferroferric oxide nanoparticles: 10%-30%; silicon carbide: 10%-20%; silica sol: 10%-20%; hexadecylamine: 5%-20%; aerogel: 5%-20%; and gallium metal: 1%-5%.

7. The circuit shielding structure, as recited in claim 1, wherein: an enhancement layer is arranged on the conductive material layer, for improving an electromagnetic shielding effect; the enhancement layer is made from a mixed material which comprises components of vinyl dimethicone, reinforced particles, silicone oil, and conductive powders with a weight ratio of (20-150):(0-20):(0-20):(110-700); the conductive powders comprise large-particle-size spherical conductive powders, small-particle-size spherical conductive powders and non-spherical conductive powders with a weight ratio of (100-500):(10-100):(0-100); and the reinforced particles comprise at least two members selected from a group consisting of white carbon black, calcium carbonate, silica powders, kieselguhr and titanium dioxides.

* * * * *